(12) United States Patent
Lou et al.

(10) Patent No.: US 11,910,683 B2
(45) Date of Patent: Feb. 20, 2024

(54) DISPLAY PANEL AND DISPLAY DEVICE

(71) Applicant: KUNSHAN GO-VISIONOX OPTO-ELECTRONICS CO., LTD, Jiangsu (CN)

(72) Inventors: Junhui Lou, Kunshan (CN); Lu Zhang, Kunshan (CN); Shixing Cai, Kunshan (CN); Yong Wu, Kunshan (CN); Lin Ge, Kunshan (CN); Yanan Ji, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 97 days.

(21) Appl. No.: 17/682,329

(22) Filed: Feb. 28, 2022

(65) Prior Publication Data

US 2022/0190055 A1 Jun. 16, 2022

Related U.S. Application Data

(63) Continuation of application No. PCT/CN2021/073366, filed on Jan. 22, 2021.

(30) Foreign Application Priority Data

Mar. 10, 2020 (CN) .......................... 202010161496.6

(51) Int. Cl.
*G09G 5/02* (2006.01)
*H10K 59/35* (2023.01)
*H10K 50/805* (2023.01)

(52) U.S. Cl.
CPC .......... *H10K 59/35* (2023.02); *H10K 50/805* (2023.02)

(58) Field of Classification Search
CPC .... H10K 59/35; H10K 50/805; H10K 50/813; H10K 59/353; H10K 59/65; H10K 59/352
(Continued)

(56) References Cited

U.S. PATENT DOCUMENTS 9,887,252 B2 2/2018 Park et al.
2017/0194390 A1* 7/2017 Kim ...................... H10K 50/82
(Continued)

FOREIGN PATENT DOCUMENTS

CN 110189639 A 8/2019
CN 110323259 A 10/2019
(Continued)

OTHER PUBLICATIONS

International Search Report dated Apr. 23, 2021 in corresponding International Application No. PCT/CN2021/073366 ; 4 pages.
(Continued)

*Primary Examiner* — Thuy N Pardo
(74) *Attorney, Agent, or Firm* — Maier & Maier, PLLC (57) ABSTRACT

A display panel and a display device. The display panel includes a transparent display region. A plurality of sub-pixels are disposed in the transparent display region and the plurality of sub-pixels are arranged in a line along at least one direction. In each line of the plurality of sub-pixels arranged along at least one direction, a bottom electrode of one sub-pixel of each two adjacent sub-pixels among at least a part of a plurality of two adjacent sub-pixels has a first shape type, and a bottom electrode of the other sub-pixel of each two adjacent sub-pixels has a second shape type; the first shape type includes a circle or an ellipse; and the second shape type is the same as a shape of a light-emitting region of the other sub-pixel of each two adjacent sub-pixels.

20 Claims, 11 Drawing Sheets

(58) Field of Classification Search
USPC .................................. 345/690, 55, 695, 697
See application file for complete search history.

(56) References Cited

U.S. PATENT DOCUMENTS

| | | | |
|---|---|---|---|
| 2017/0250240 A1* | 8/2017 | Lee | H10K 59/131 |
| 2017/0256747 A1 | 9/2017 | Lee et al. | |
| 2023/0006004 A1* | 1/2023 | Li | H10K 99/00 |
| 2023/0162682 A1* | 5/2023 | Wang | G09G 3/3258 345/55 |
| 2023/0162683 A1* | 5/2023 | Wang | H10K 59/35 345/55 |

FOREIGN PATENT DOCUMENTS

| | | |
|---|---|---|
| CN | 110767139 A | 2/2020 |
| CN | 110767708 A | 2/2020 |
| CN | 110767720 A | 2/2020 |
| CN | 110867476 A | 3/2020 |
| CN | 111341936 A | 6/2020 |
| IN | 110767672 A | 2/2020 |
| TW | 201921064 A | 6/2019 |

OTHER PUBLICATIONS

First Office Action dated Apr. 9, 2021 in corresponding Chinese Application No. 202010161496.6; 16 pages.
Second Office Action dated Jul. 7, 2021 in corresponding Chinese Application No. 202010161496.6; 14 pages.

\* cited by examiner

DISPLAY PANEL AND DISPLAY DEVICE

CROSS-REFERENCE TO RELATED APPLICATION

This is a continuation of International Patent Application No. PCT/CN2021/073366, filed on Jan. 22, 2021, which is based on and claims priority to a Chinese Patent Application No. CN 202010161496.6 filed on Mar. 10, 2020, disclosures of which are incorporated herein by reference in their entireties.

TECHNICAL FIELD

The present disclosure relates to the technical field of display panels, for example, a display panel and a display device.

BACKGROUND

With the rapid development of electronic devices, users have higher and higher requirements for a screen-to-body ratio so that full screen display of the electronic devices is more and more concerned by the industry. The electronic device, such as a mobile phone and a tablet computer, needs to integrate components such as a front-facing camera, a receiver, and an infrared sensing element. Therefore, a notch is provided in a display screen, and components such as the camera, the receiver, and the infrared sensing element, are disposed in the notch region. However, the electronic device does not have a full screen in the true sense and display cannot be performed on all regions of an entire screen. For example, a picture cannot be displayed in a camera region.

In order to achieve a real full screen, the under-screen camera technology arises, that is, a region where the camera is disposed in the display screen may still be used for display, that is, the region where the camera is disposed in the display screen is still provided with pixels. However, in the region where the camera is disposed in the display screen, regular slits are formed between opaque metal structures in the pixels, and diffraction will be caused when external light passes through the region where the camera is disposed in the display panel. Thus, a photographing effect of the camera is seriously affected.

SUMMARY

The present disclosure provides a display panel and a display device, which may improve transparency of a transparent display region and reduce a diffraction impact.

A display panel having a transparent display region is provided, and the display panel includes a plurality of sub-pixels disposed in the transparent display region.

In two adjacent sub-pixels among at least a part of a plurality of two adjacent sub-pixels of the plurality of sub-pixels, a bottom electrode of one sub-pixel of the two adjacent sub-pixels has a first shape type, and a bottom electrode of the other sub-pixel of the two adjacent sub-pixels has a second shape type.

The second shape type is the same as a shape of a light-emitting region of the other sub-pixel of the two adjacent sub-pixels.

Where the first shape type is different from the second shape type, the first shape type includes a circle or an ellipse, and the plurality of sub-pixels are arranged in lines.

Bottom electrodes of a part of sub-pixels are configured to have the first shape type and bottom electrodes of the other part of sub-pixels are configured to have the second shape type, so that regular slits may be effectively prevented from being formed between the bottom electrodes of the sub-pixels. Thus, the diffraction impact is reduced, photographing effects of photosensitive components such as a camera are improved, area utilization rates of the bottom electrodes are increased, and thus the transparency of the transparent display region is improved.

Optionally, the sub-pixels in each line of the plurality of sub-pixels are divided to form a plurality of first repeating units, each first repeating unit among the plurality of first repeating units includes three sub-pixels which are sequentially arranged. In the first repeating unit of at least a part of the plurality of first repeating units, bottom electrodes of two adjacent sub-pixels have the first shape type, and a bottom electrode of another sub-pixel has the second shape type. The bottom electrodes of a part of sub-pixels in the first repeating unit is configured to have the first shape type and bottom electrodes of another part of sub-pixels in the first repeating unit is configured to have the second shape type, so that the bottom electrodes of the two shape types are evenly arranged. Thus, a transmittance of each part of the transparent display region is improved, and diffraction in each part of the transparent display region is reduced.

Optionally, the sub-pixel having the bottom electrode of the second shape type is a green sub-pixel. Since the green sub-pixel has the light-emitting region of the largest size among a red sub-pixel, a green sub-pixel, and a blue sub-pixel, the bottom electrode of the green sub-pixel is configured to have the second shape type, so that the area utilization rate of the bottom electrode of the green sub-pixel may be increased, the area of the region where the bottom electrode does not overlap the light-emitting region can be reduced, and the transparency of the transparent display region may be improved.

Optionally, the sub-pixels in the each line of the plurality of sub-pixels are divided to form a plurality of first repeating units, each first repeating unit among the plurality of first repeating units includes three sub-pixels which are sequentially arranged. In the first repeating unit of at least a part of the plurality of first repeating units, bottom electrodes of two adjacent sub-pixels have the second shape type, and a bottom electrode of another sub-pixel has the first shape type. The bottom electrodes of a part of sub-pixels in the first repeating unit is configured to have the first shape type and the bottom electrodes of another part of sub-pixels in the first repeating unit is configured to have the second shape type, so that the bottom electrodes of the two shape types are evenly arranged. Thus, the transmittance of each part of the transparent display region is improved, and the diffraction in each part of the transparent display region is reduced.

Optionally, the two adjacent sub-pixels having the bottom electrodes of the second shape type are a green sub-pixel and a blue sub-pixel. Since the size of the light-emitting region of the green sub-pixel and the size of the light-emitting region of the blue sub-pixel are each larger than the size of the light-emitting region of the red sub-pixel, the bottom electrode of the green sub-pixel and the bottom electrode of the blue sub-pixel are configured to have the second shape type so that the area utilization rates of the bottom electrode of the green sub-pixel and the bottom electrode of the blue sub-pixel may be increased, the area of the region where the bottom electrode does not overlap the light-emitting region may be reduced, and the transparency of the transparent display region may be improved.

Optionally, in the line of the plurality of sub-pixels, sub-pixels which have bottom electrodes of the first shape type and sub-pixels which have bottom electrodes of the second shape type are arranged alternately, so that the transmittance of each part of the transparent display region is improved and the diffraction in each part of the transparent display region is reduced.

Optionally, virtual triangles which correspond to two pixels adjacently arranged along the first direction have vertex angles pointing to opposite directions along a second direction, and the first direction is perpendicular to the second direction. Each of the two pixels adjacently arranged along the first direction is turned over by 180 degrees along the first direction and then an arrangement structure of sub-pixels in the pixel is the same as an arrangement structure of sub-pixels in an adjacent pixel in the same line. In this manner, the pixels are arranged more closely so that it is beneficial to reducing spaces between the pixels and improving a resolution of the display device.

Optionally, the plurality of sub-pixels are arranged in a matrix, along a row direction along which the plurality of sub-pixels are arranged, sub-pixels which have bottom electrodes of the first shape type and sub-pixels which have bottom electrodes of the second shape type are arranged alternately. Along a column direction along which the plurality of sub-pixels are arranged, sub-pixels which have bottom electrodes of the first shape type and sub-pixels which have bottom electrodes of the second shape type are arranged alternately, so that the transmittance of each part of the transparent display region is improved and the diffraction in each part of the transparent display region is reduced.

A display device is further provided, and the display device includes the above-mentioned display panel and includes a photosensitive component disposed below a transparent display region of the display panel. The bottom electrodes of one part of sub-pixels are configured to have the first shape type and the bottom electrodes of the other part of sub-pixels are configured to have the second shape type so that the regular slits may be effectively prevented from being formed between the bottom electrodes of the sub-pixels. Thus, the diffraction impact is reduced, the photographing effects of the photosensitive components such as a camera are improved, the area utilization rates of the bottom electrodes are increased, and the transparency of the transparent display region is improved.

In technical solutions of the present disclosure, the display panel having the transparent display region includes the plurality of sub-pixels disposed in the transparent display region. In two adjacent sub-pixels among at least a part of a plurality of two adjacent sub-pixels of the plurality of sub-pixels, the bottom electrode of one sub-pixel of the two adjacent sub-pixels has the first shape type, and the bottom electrode of the other sub-pixel of the two adjacent sub-pixels has the second shape type. The bottom electrode of the sub-pixel which has the bottom electrode of the second shape type has the same shape as the light-emitting region of the bottom electrode. The first shape type is different from the second shape type, the first shape type includes the circle or the ellipse, and the plurality of sub-pixels are arranged in lines. The bottom electrodes of a part of sub-pixels are configured to have the first shape type, so that the regular slits may be effectively prevented from being formed between the bottom electrodes of the sub-pixels, the diffraction impact is reduced, and the photographing effects of the photosensitive components such as a camera are improved. The bottom electrodes of another part of sub-pixels are configured to have the second shape type, so that the area occupied by the bottom electrodes is saved, an area utilization rate of the transparent display region is increased, and the transparency of the transparent display region is improved.

DETAILED DESCRIPTION

The present disclosure is described below in conjunction with drawings and embodiments.

Figure 1:
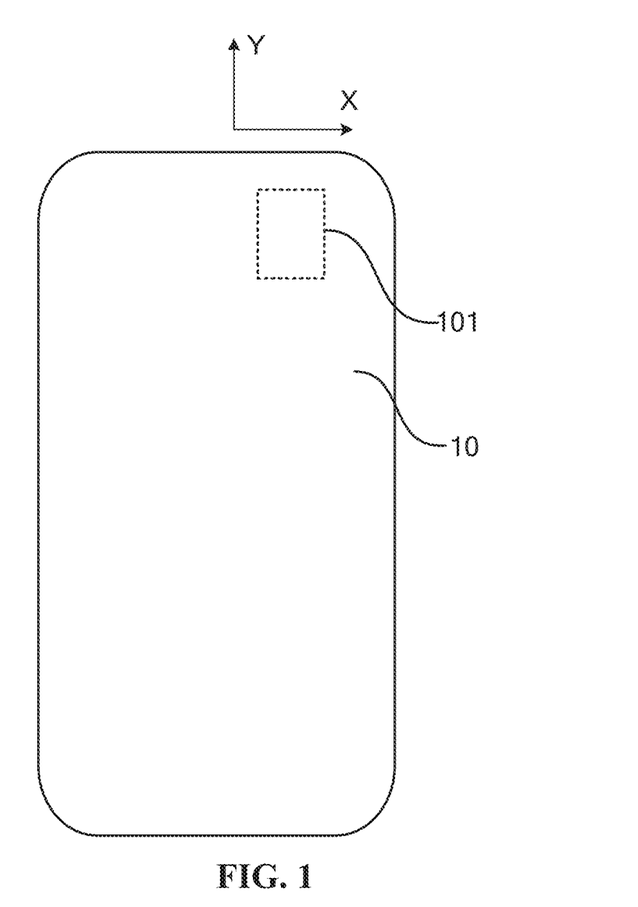
FIG. 1 is a structure diagram of a display panel according to an embodiment.
Figure 2:
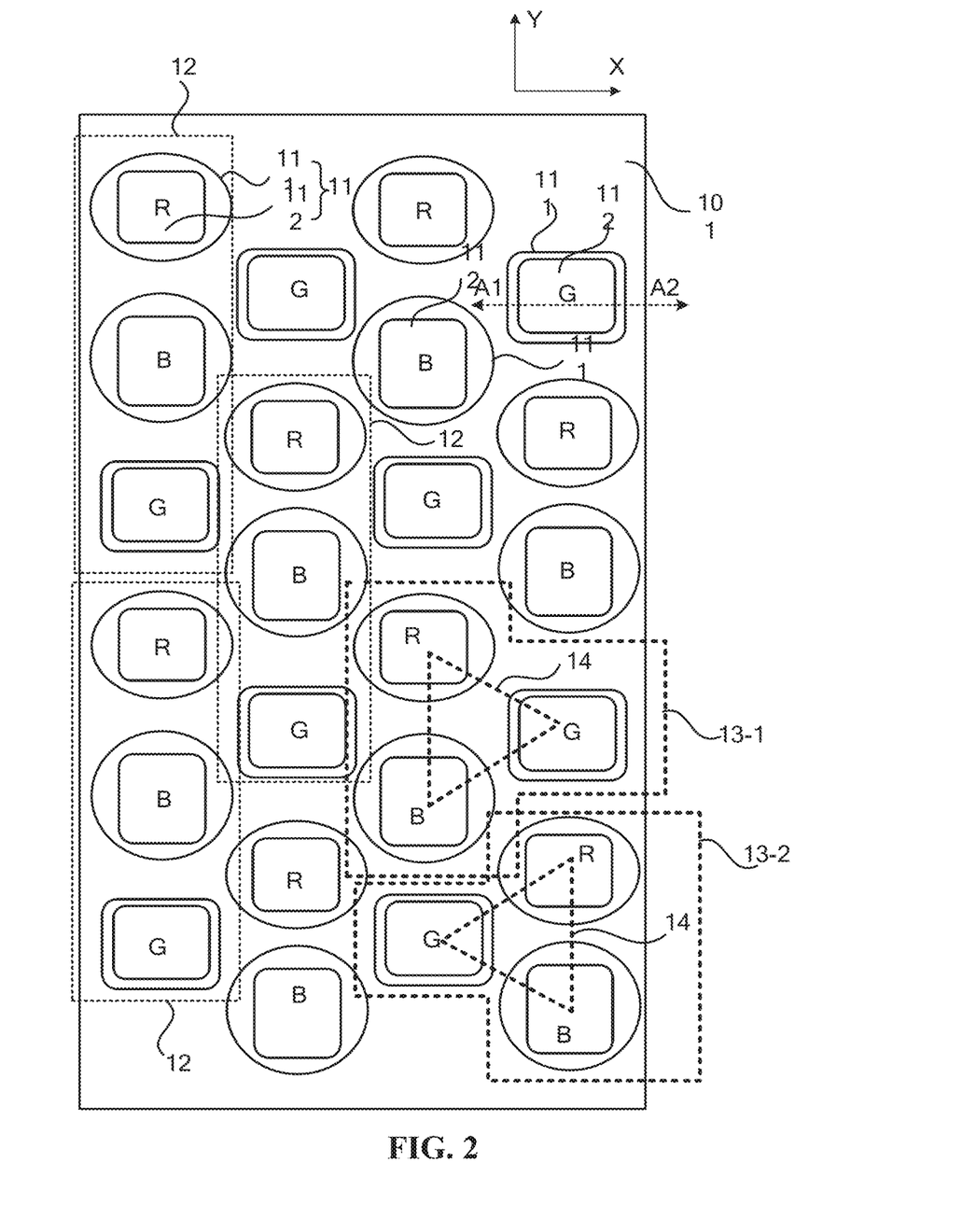
FIG. 2 is a structure diagram showing a part of a transparent display region of a display panel according to an embodiment.
Figure 3:
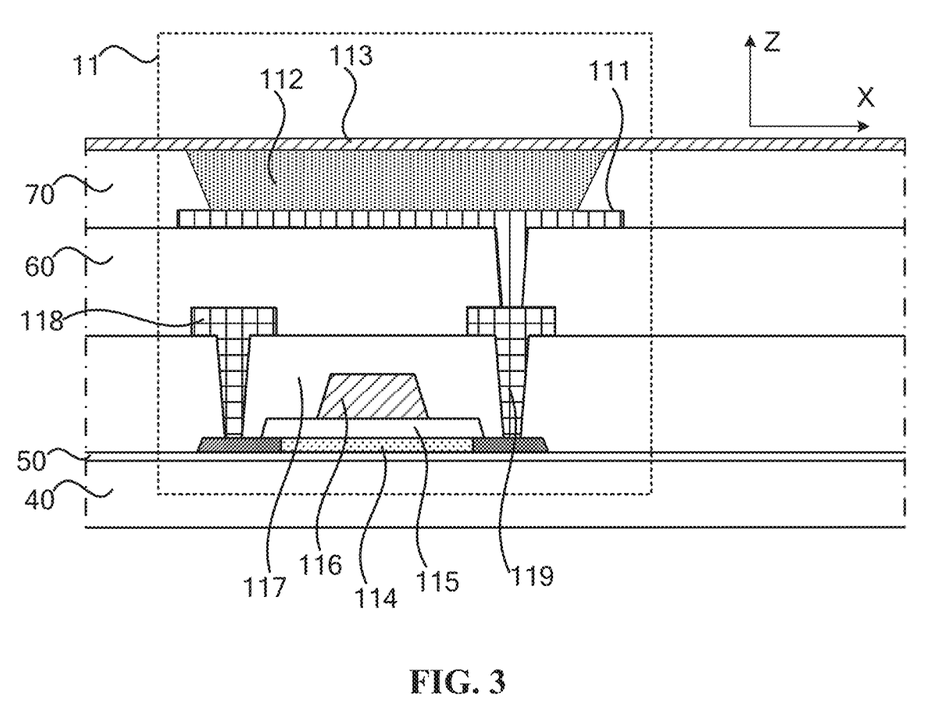
FIG. 3 is a cross-sectional view of a part of a transparent display region of a display panel according to an embodiment.

This embodiment provides a display panel. FIG. 1 is a structure diagram of a display panel according to an embodiment, FIG. 2 is a structure diagram showing a part of a transparent display region of a display panel according to an embodiment, FIG. 3 is a cross-sectional view of a part of a transparent display region of a display panel according to an embodiment. Referring to FIGS. 1 to 3, the display panel having a transparent display region 10 includes a plurality of sub-pixels 11 disposed in the transparent display region 10.

The plurality of sub-pixels 11 are arranged in a line along at least one direction. In two adjacent sub-pixels 11 among at least a part of a plurality of two adjacent sub-pixels 11 of the plurality of sub-pixels 11, a bottom electrode 111 of one sub-pixel 11 of two adjacent sub-pixels 11 has a first shape type, and a bottom electrode 111 of the other sub-pixel 11 of two adjacent sub-pixels 11 has a second shape type. The bottom electrode 111 of the sub-pixel 11 which has the bottom electrode 111 of the second shape type has the same shape as the light-emitting region 112 of the sub-pixel 11. The first shape type is different from the second shape type, first shape type includes a circle or an ellipse, and the plurality of sub-pixels 11 are arranged in lines.

The entire display region of the display panel may be partially transparent or completely transparent. The size of the transparent display region may be configured according to needs, which is not limited in this embodiment. FIG. 1 exemplarily illustrates a case where the entire display region of the display panel is transparent. FIG. 2 exemplarily illustrates a case where sub-pixels 11 in a partial region 101 of the transparent display region 10 are arranged in a line along a first direction Y. The sub-pixels 11 may also be arranged in a line along a second direction X, which is not limited in this embodiment. The arrangement of pixels in other regions of the transparent display region 10 is the same as or similar to the arrangement of pixels in the partial region 101. Optionally, shapes of light-emitting regions 112 of the sub-pixels 11 include at least one of a triangle, a square, a pentagon, a circle, an ellipse, a rectangle, and a rounded rectangle. Optionally, the second shape type includes at least one of a triangle, a square, a pentagon, a circle, an ellipse, and a rounded rectangle. The shapes of the light-emitting regions 112 of all sub-pixels 11 in the transparent display region 10 may be the same or different. The first shape type and the second shape type may be the same or different. FIG. 2 exemplarily illustrates a case where the light-emitting regions 112 of all sub-pixels 11 have the same shape. FIG. 2 exemplarily illustrates a case where the shape of each of the light-emitting regions 112 of all sub-pixels 11 is a rounded rectangle and the second shape type may be a rounded rectangle. The plurality of sub-pixels 11 may include a red sub-pixel R, a green sub-pixel G, and a blue sub-pixel B.

FIG. 3 is a cross-sectional view of a sub-pixel taken along a section line A1-A2 in FIG. 2 according to an embodiment. As shown in FIG. 3, the display panel further includes a substrate 40, a drive line layer located on the substrate 40, and a light-emitting unit located on a side of the drive line layer facing away from the substrate 40. The light-emitting unit may be an organic light-emitting diode. The light-emitting unit includes the bottom electrode 111, a light-emitting functional layer (that is the light-emitting region 112) and a top electrode 113 which are arranged in a stack along a direction away from the substrate 40. The bottom electrode 111 of the sub-pixel 11 may be an anode. The drive line layer may include a plurality of conductive layers, a plurality of inorganic insulating layers, and an active layer 114 which are arranged in a stack so as to form components such as thin-film transistors, storage capacitors in a pixel driving circuit and so as to form scanning lines, data lines, light emission control lines, and the like. The thin-film transistor may include a semiconductor active layer 114, a gate insulating layer 115, a gate 116, an interlayer insulating layer 117, a source 118, and a drain 119. The sub-pixel 11 may include the pixel driving circuit and the light-emitting unit. The bottom electrode 111 of the light-emitting unit is electrically connected to the drain 119 of the thin-film transistor through a via which passes through a planarization layer 60. The pixel driving circuit is electrically connected to the corresponding scanning line, the corresponding data line, the corresponding light emission control line, and the like so as to receive a scanning signal, a data signal, a light emission control signal, and the like. Furthermore, a drive current is outputted to the light-emitting unit so as to control brightness and light emission time of the corresponding light-emitting unit. The display panel further includes a buffer layer 50 which is located between the substrate 40 and the semiconductor active layer 114. The drive line layer further includes a pixel defining layer 70 which is located on a side of the planarization layer 60 and the bottom electrode 111 facing away from the substrate 40. The pixel defining layer 70 is provided with a pixel aperture which exposes the bottom electrode 111. The light-emitting functional layer and the top electrode 113 cover the pixel aperture. One pixel aperture may correspond to one light-emitting unit. One light-emitting unit may correspond to one sub-pixel 11. The light-emitting region 112 of the sub-pixel 11 is the region where the light-emitting functional layer is located. Optionally, along a direction Z of thickness of the display panel, the projection of the light-emitting region 112 of the sub-pixel 11 on the bottom electrode 111 of the sub-pixel 11 is within the bottom electrode 111. The direction Z may be perpendicular to the first direction Y. The direction Z may be perpendicular to the second direction X. The first direction Y may be perpendicular to the second direction X. The light-emitting region 112 of the sub-pixel 11 may be located in a middle region of the bottom electrode 111 of the sub-pixel 11.

The bottom electrode 111 is made of a non-transparent material. The region of the bottom electrode 111 of the sub-pixel 11 that is not covered by the light-emitting functional layer (that is the light-emitting region 112) is neither luminous nor transparent. Therefore, the smaller the region of the bottom electrode 111 of the sub-pixel 11 that is not covered by the light-emitting functional layer (that is the light-emitting region 112) is, the lower the proportion of a non-transparent region is and the higher the proportion of a transparent region is, that is, the higher the ratio S1/S2 of the area of the light-emitting region 112 of the sub-pixel 11 to the area of the bottom electrode 111 of the sub-pixel 11 is. The bottom electrode 111 of the sub-pixel 11 has the second shape type, that is, the bottom electrode 111 of the sub-pixel 11 has the same shape as the light-emitting region 112 of the sub-pixel 112. Thus, the ratio S1/S2 of the area S1 of the light-emitting region 112 of the sub-pixel 11 to the area S2 of the bottom electrode 111 of the sub-pixel 11 is high. Optionally, the ratio S1/S2 of the area of the light-emitting region 112 of the sub-pixel 11 having the bottom electrode 111 of the first shape type to the area of the bottom electrode 111 of the sub-pixel 11 having the bottom electrode 111 of the first shape type is lower than or equal to the ratio S1/S2 of the area of the light-emitting region 112 of the sub-pixel 11 having the bottom electrode 111 of the second shape type to the area of the bottom electrode 111 of the sub-pixel 11 having the bottom electrode 111 of the second shape type. The area utilization rate of the bottom electrode 111 of the sub-pixel 11 having the bottom electrode 111 of the first shape type is lower than or equal to the area utilization rate of the bottom electrode 111 of the sub-pixel 11 having the bottom electrode 111 of the second shape type. An aperture on a fine metal mask (FMM) for manufacturing the light-emitting functional layer of the organic light-emitting diode may be designed to be approximately square or approximately circular. In order to increase an aperture ratio, the light-emitting region 112 of the sub-pixel 11 may also be designed to be approximately square or approximately circular.

If the bottom electrode 111 of the sub-pixel 11 has the first shape type, for example, a circle or an ellipse, long lines or regular slits may be effectively prevented from being easily formed between the bottom electrodes of the sub-pixels and from causing diffraction when external light passes through the transparent display region. Thus, a diffraction impact is reduced, and photographing effects of photosensitive components such as a camera are improved. If the bottom electrode 111 of the sub-pixel 11 has the second shape type, the region of the bottom electrode 111 of the sub-pixel 11 that is not covered by the light-emitting functional layer is small, which is beneficial to improving transparency of the transparent display region 10. The bottom electrodes 111 of one part of sub-pixels 11 are configured to have the first shape type and the bottom electrodes 111 of the other part of sub-pixels 11 are configured to have the second shape type so that the regular slits may be effectively prevented from being formed between the bottom electrodes of the sub-pixels. Thus, the diffraction impact is reduced, the photographing effects of the photosensitive components such as a camera are improved, area utilization rates of the bottom electrodes are increased, and the transparency of the transparent display region 10 is improved.

In technical solutions of this embodiment, the display panel having the transparent display region includes plurality of sub-pixels disposed in the transparent display region. The plurality of sub-pixels are arranged in a line along at least one direction. In two adjacent sub-pixels among at least a part of a plurality of two adjacent sub-pixels of the plurality of sub-pixels, the bottom electrode of one sub-pixel of two adjacent sub-pixels has the first shape type, and the bottom electrode of the other sub-pixel of two adjacent sub-pixels has the second shape type. The bottom electrode of the sub-pixel which has the bottom electrode of the second shape type has the same shape as the light-emitting region of the bottom electrode. The first shape type is different from the second shape type, the first shape type includes the circle or the ellipse, and the plurality of sub-pixels are arranged in lines. The bottom electrodes of a part of sub-pixels are configured to have the first shape type and the bottom electrodes of the other part of sub-pixels are configured to have the second shape type so that the regular slits may be effectively prevented from being formed between the bottom electrodes of the sub-pixels. Thus, the diffraction impact is reduced, the photographing effects of the photosensitive components such as a camera are improved, the area utilization rates of the bottom electrodes are increased, and the transparency of the transparent display region is improved.

This embodiment further provides a display panel. Based on the above-mentioned embodiment, referring to FIG. 2, sub-pixels 11 in each line of sub-pixels 11 are divided to form a plurality of first repeating units 12, each first repeating unit 12 includes three sequentially arranged sub-pixels 111. In the first repeating unit 12 of at least a part of the plurality of first repeating units, and the bottom electrodes 111 of two adjacent sub-pixels 11 have the first shape type, and the bottom electrode 111 of the other sub-pixel 11 has the second shape type.

FIG. 2 exemplarily illustrates the plurality of first repeating units 12. The remaining first repeating units may be sequentially determined according to arrangement orders and shapes of the sub-pixels 11. The number of first repeating units 12 is not limited in this embodiment. In each line of sub-pixels 11 arranged along at least one direction, every three sub-pixels 11 form one first repeating unit 12, and six sub-pixels 11 in two adjacent first repeating units 12 are arranged sequentially adjacent to each other. Two adjacent sub-pixels 11 which have the bottom electrodes 111 of the first shape type may be any two of the red sub-pixel R, the green sub-pixel G, and the blue sub-pixel B. FIG. 2 exemplarily illustrates a case where the two adjacent sub-pixels 11 which have the bottom electrodes 111 of the first shape type are the red sub-pixel R and the blue sub-pixel B. The bottom electrode 111 of each sub-pixel 11 of one part of sub-pixels 11 in each first repeating unit 12 is configured to have the first shape type and the bottom electrode 111 of each sub-pixel 11 of the other part of sub-pixels 11 in each first repeating unit is configured to have the second shape type so that the bottom electrodes 111 of the two shape types are evenly arranged, the transmittance of the transparent display region 10 is improved, and the diffraction in the transparent display region 10 is reduced.

Optionally, based on the above-mentioned embodiment, referring to FIG. 2, in at least a part of the first repeating units 12, the sub-pixel 11 which has the bottom electrode 111 of the second shape type is the green sub-pixel G. FIG. 2 exemplarily illustrates a case where the bottom electrode 11 of the green sub-pixel G has the second shape type, and the bottom electrode 111 of the red sub-pixel R and the bottom electrode 111 of the blue sub-pixel B have the first shape type.

Since the green sub-pixel G has the light-emitting region 112 of the largest size among the red sub-pixel R, the green sub-pixel G, and the blue sub-pixel B, the bottom electrode 111 of the green sub-pixel G is configured to have the second shape type so that the area utilization rate of the bottom electrode 111 of the green sub-pixel G may be increased, the area of the region where the bottom electrode 111 does not overlap the light-emitting region 112 may be reduced, and the transparency of the transparent display region 10 may be improved.

Figure 4:
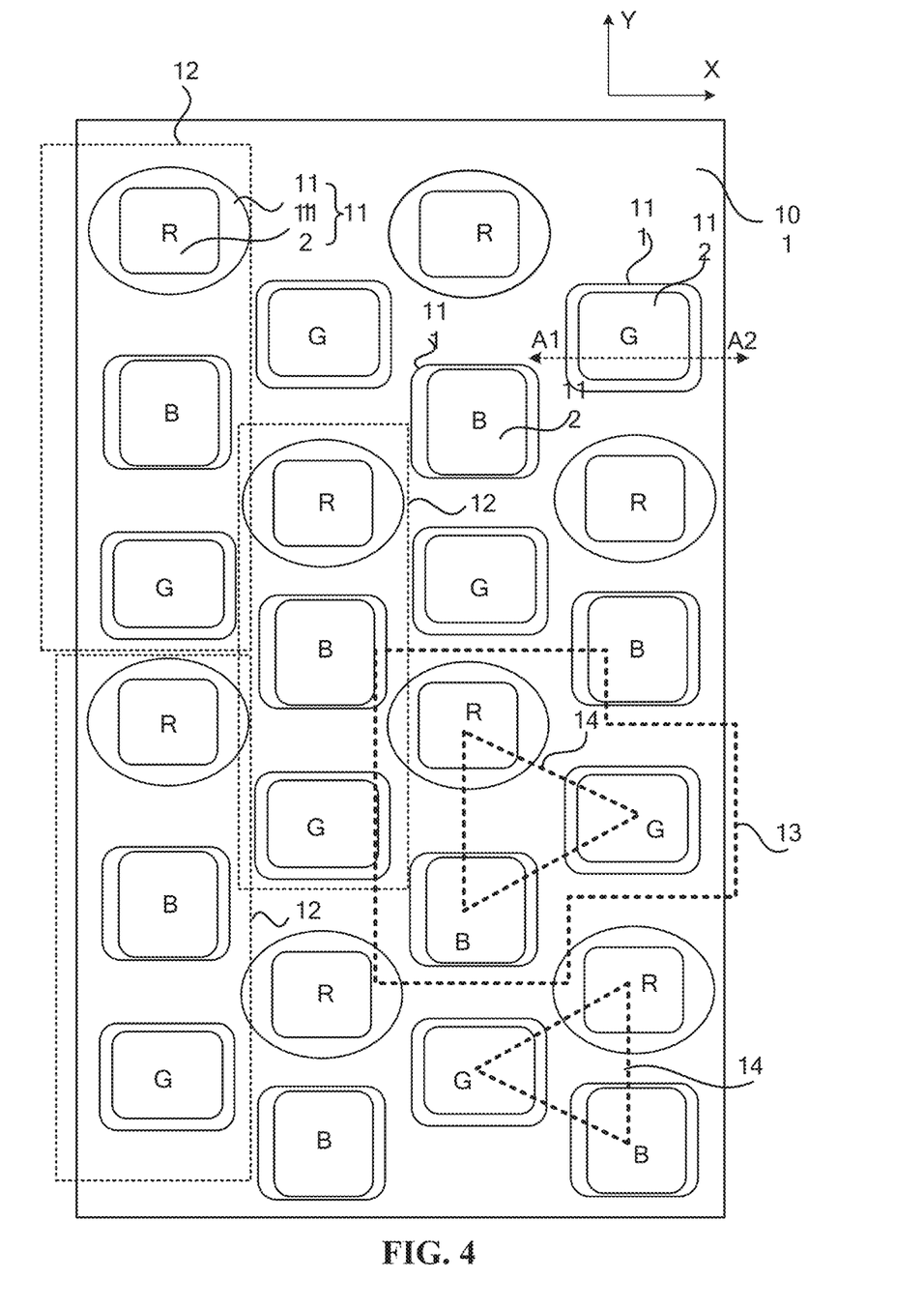
FIG. 4 is a structure diagram showing a part of a transparent display region of another display panel according to an embodiment.

This embodiment further provides a display panel. FIG. 4 is a structure diagram of a transparent display region of another display panel according to an embodiment. Based on the above-mentioned embodiment, sub-pixels 11 in each line of sub-pixels 11 of the plurality of sub-pixels 11 are divided to form the plurality of first repeating units 12. Each first repeating unit 12 includes three sequentially arranged sub-pixels 11 of the plurality of sub-pixels 11. In the first repeating unit 12 of at least a part of the plurality of first repeating units 12, the bottom electrodes 111 of the two adjacent sub-pixels 11 have the second shape type, and the bottom electrode 111 of the other sub-pixel 11 has the first shape type.

In the first repeating unit 12, the two adjacent sub-pixels 11 which have the bottom electrodes 111 of the second shape type may be any two of the red sub-pixel R, the green sub-pixel G, and the blue sub-pixel B. FIG. 4 exemplarily illustrates a case where the shape of each of the light-emitting regions 112 of all sub-pixels 11 is the rounded rectangle and the second shape type is the rounded rectangle. Compared with the technical solution illustrated in FIG. 2, the technical solution illustrated in FIG. 4 may improve the transparency of the transparent display region 10. Compared with the technical solution illustrated in FIG. 4, the technical solution illustrated in FIG. 2 may reduce the diffraction impact.

Optionally, based on the above-mentioned embodiment, referring to FIG. 4, in at least a part of the first repeating units 12, the two sub-pixels 11 which have the bottom electrodes 111 of the second shape type are the green sub-pixel G and the blue sub-pixel B. FIG. 4 exemplarily illustrates a case where the light-emitting regions 112 of all sub-pixels 11 are approximately rectangular, the bottom electrode 111 of the green sub-pixel G and the bottom electrode 111 of the blue sub-pixel B are approximately rectangular, and the bottom electrode 111 of the red sub-pixel R is approximately circular. Since the size of the light-emitting region 112 of the green sub-pixel G and the size of the light-emitting region 112 of the blue sub-pixel B are each larger than the size of the light-emitting region 112 of the red sub-pixel R for the red sub-pixel R, the green sub-pixel G, and the blue sub-pixel B, the bottom electrode 111 of the green sub-pixel G and the bottom electrode 111 of the blue sub-pixel B are configured to have the second shape type so that the area utilization rates of the bottom electrodes 111 of the green sub-pixel G and the blue sub-pixel B may be increased, the area of the region where the bottom electrode 111 does not overlap the light-emitting region 112 may be reduced, and the transparency of the transparent display region 10 may be improved.

Figure 5:
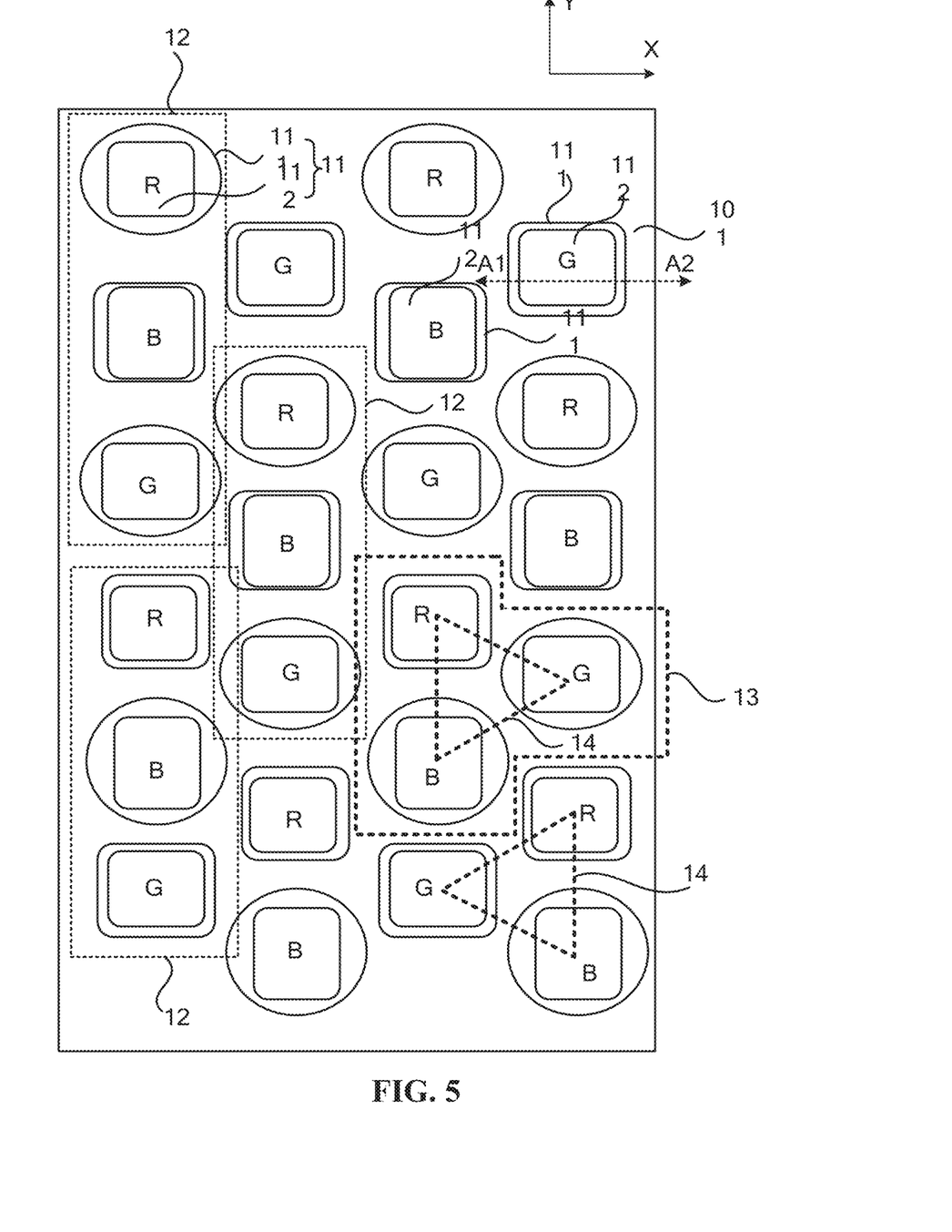
FIG. 5 is a structure diagram showing a part of a transparent display region of another display panel according to an embodiment.

This embodiment further provides a display panel. FIG. 5 is a structure diagram showing a part of a transparent display region of another display panel according to an embodiment. Based on the above-mentioned embodiment, in one line of sub-pixels 11 arranged along at least one direction, the sub-pixels 11 which have the bottom electrodes 111 of the first shape type and the sub-pixels 11 which have the bottom electrodes 111 of the second shape type are arranged alternately.

FIG. 5 exemplarily illustrates a case where the shape of each of the light-emitting regions 112 of all sub-pixels 11 is the rounded rectangle and the second shape type is the rounded rectangle. Compared with the technical solution illustrated in FIG. 2, the technical solution illustrated in FIG. 5 may improve the transparency of the transparent display region 10. Compared with the technical solution illustrated in FIG. 5, the technical solution illustrated in FIG. 2 may reduce the diffraction impact. Compared with the technical solution illustrated in FIG. 4, the technical solution illustrated in FIG. 5 may reduce the diffraction impact. Compared with the technical solution illustrated in FIG. 5, the technical solution illustrated in FIG. 4 may improve the transparency of the transparent display region 10. The larger the number of sub-pixels 11 which have the bottom electrodes 111 of the first shape type is, the more beneficial it is to reducing the diffraction impact, and the larger the number of sub-pixels 11 which have the bottom electrodes 111 of the second shape type is, the more beneficial it is to improving the transparency of the transparent display region 10. The shape of the bottom electrode 111 of the sub-pixel 11 may be configured according to needs to balance the diffraction impact and the transparency.

Optionally, based on the above-mentioned embodiment, referring to FIG. 2, FIG. 4, and FIG. 5, the plurality of sub-pixels 11 are arranged in a line along the first direction Y; and the plurality of sub-pixels 11 form a plurality of pixels 13. Each pixel 13 includes three sub-pixels 11 emitting light of different colors, two sub-pixels 11 in each pixel 13 are arranged along the first direction Y, and virtual centers of the three sub-pixels 11 in each pixel 13 are connected to form a virtual triangle.

The three sub-pixels 11 emitting the light of different colors may include the red sub-pixel R, the green sub-pixel G, and the blue sub-pixel B. Brightness of light emitted by the three sub-pixels 11 emitting the light of different colors in each pixel 13 is controlled so that any color may be formed by combination and a desired picture may be displayed on the display panel. The virtual center of the sub-pixel 11 may be a geometric center of the sub-pixel 11. For example, the light-emitting region 112 of the sub-pixel 11 is rectangular and the virtual center of the sub-pixel 11 is the geometric center of the rectangular light-emitting region 112.

Optionally, based on the above-mentioned embodiment, referring to FIG. 2, FIG. 4, and FIG. 5, virtual triangles which correspond to two pixels 13 adjacently arranged along the first direction Y have vertex angles pointing to opposite directions along the second direction X; and the first direction Y is perpendicular to the second direction X.

For example, as shown in FIG. 2, the pixel 13-1 is disposed adjacent to the pixel 13-2 along the first direction Y, the virtual triangle corresponding to the pixel 13-1 has the vertex angle pointing to the right along the second direction X, and the virtual triangle corresponding to the pixel 13-2 has the vertex angle pointing to the left along the second direction X. Each of the two pixels 13 adjacently arranged along the first direction Y is turned over by 180 degrees along the first direction Y and then an arrangement structure of sub-pixels 11 in the pixel 13 is the same as an arrangement structure of sub-pixels 11 in an adjacent pixel 13 in the same line. In this manner, the pixels are arranged more closely so that it is beneficial to reducing spaces between the pixels and improving a resolution of the display device.

Figure 6:
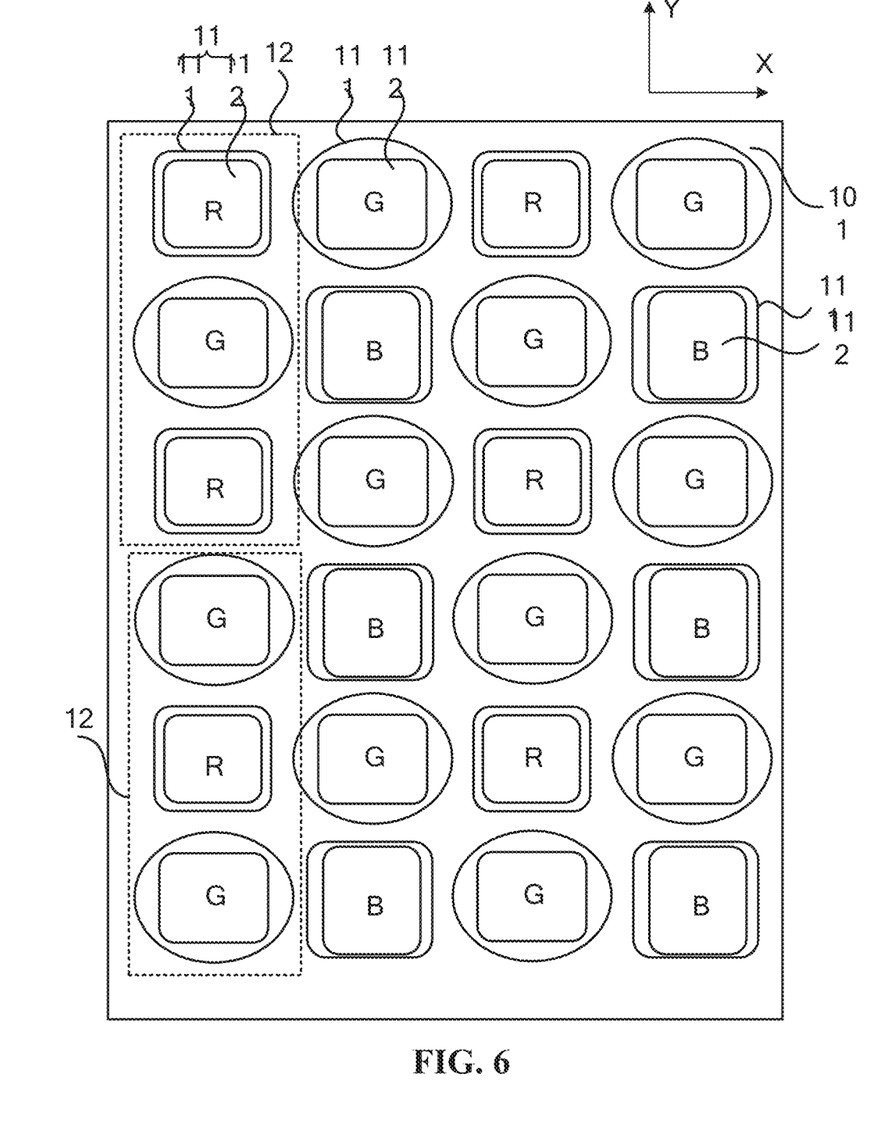
FIG. 6 is a structure diagram showing a part of a transparent display region of another display panel according to an embodiment.

This embodiment further provides a display panel. FIG. 6 is a structure diagram showing a part of a transparent display region of another display panel according to an embodiment. Based on the above-mentioned embodiment, the plurality of sub-pixels 11 are arranged in a matrix.

Optionally, based on the above-mentioned embodiment, referring to FIG. 6, along a row direction along which the plurality of sub-pixels 11 are arranged, sub-pixels 11 which have the bottom electrodes 111 of the first shape type and sub-pixels 11 which have the bottom electrodes 111 of the second shape type are arranged alternately, and along a column direction along which the plurality of sub-pixels 11 are arranged, sub-pixels 11 which have the bottom electrodes 111 of the first shape type and sub-pixels 11 which have the bottom electrodes 111 of the second shape type are arranged alternately.

The first direction Y may be the column direction and the second direction X may be the row direction. FIG. 6 exemplarily illustrates a case where the shape of each of the light-emitting regions 112 of all sub-pixels 11 is the rounded rectangle and the second shape type is the rounded rectangle. FIG. 6 exemplarily illustrates a case where the bottom electrode 111 of the green sub-pixel G has the first shape type, and the bottom electrode 111 of the red sub-pixel R and the bottom electrode 111 of the blue sub-pixel B have the second shape type. As shown in FIG. 6, along the row direction X along which the sub-pixels 11 are arranged, the red sub-pixels R which have the bottom electrodes 111 of the second shape type and the green sub-pixels G which have the bottom electrodes 111 of the first shape type are arranged alternately in the odd-numbered rows of the sub-pixels 11, and the green sub-pixels G which have the bottom electrodes 111 of the first shape type and the blue sub-pixels B which have the bottom electrodes 111 of the second shape type are arranged alternately in the even-numbered rows of the sub-pixels 11. Along the column direction Y along which the sub-pixels 11 are arranged, the red sub-pixels R which have the bottom electrodes 111 of the second shape type and the green sub-pixels G which have the bottom electrodes 111 of the first shape type are arranged alternately in the odd-numbered columns of the sub-pixels 11, and the green sub-pixels G which have the bottom electrodes 111 of the first shape type and the blue sub-pixels B which have the bottom electrodes 111 of the second shape type are arranged alternately in the even-numbered columns of the sub-pixels 11.

Figure 7:
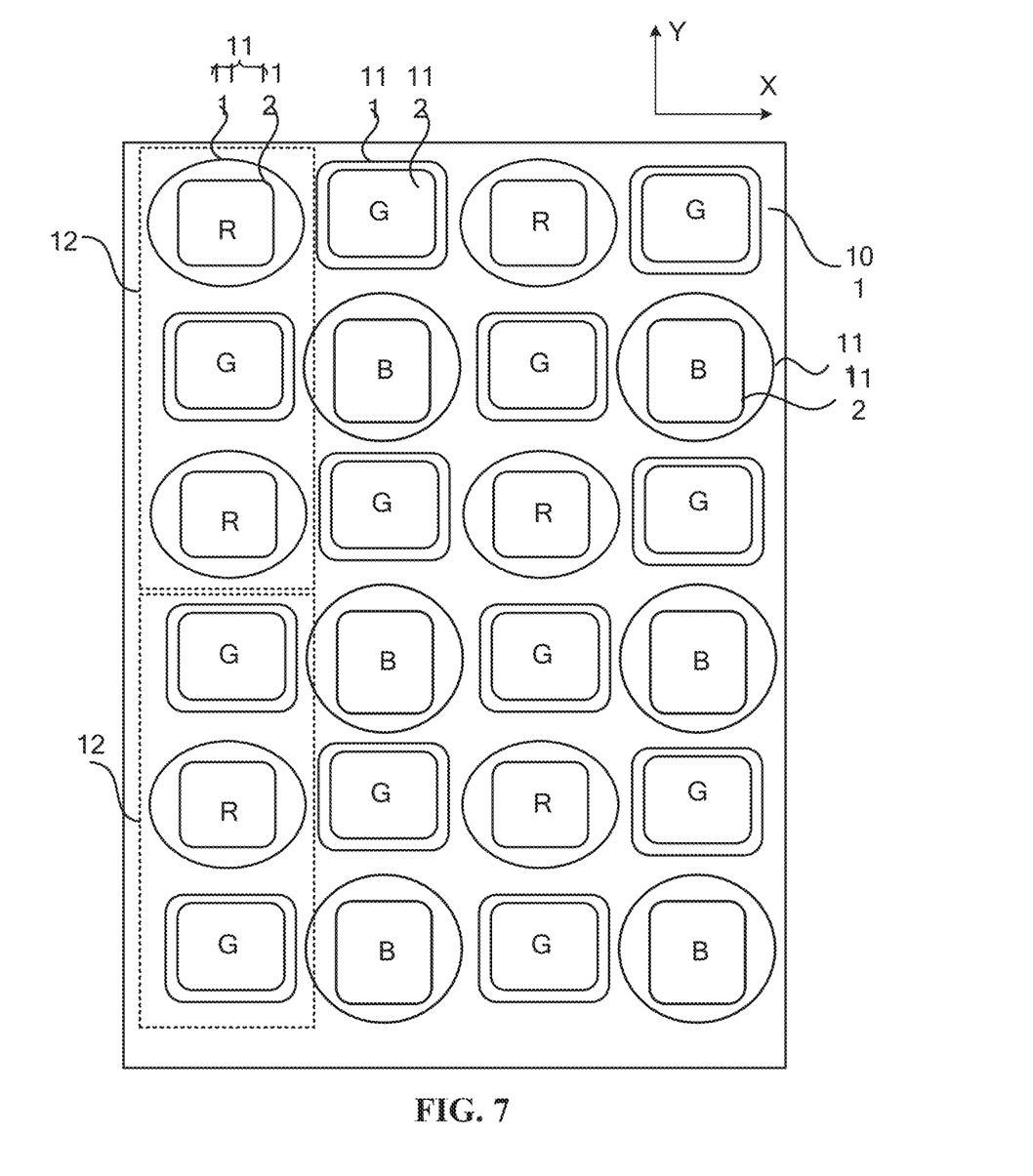
FIG. 7 is a structure diagram showing a part of a transparent display region of another display panel according to an embodiment.

FIG. 7 is a structure diagram showing a part of a transparent display region of another display panel according to an embodiment. FIG. 7 exemplarily illustrates a case where the shape of each of the light-emitting regions 112 of all sub-pixels 11 is the rounded rectangle and the second shape type is the rounded rectangle. FIG. 7 exemplarily illustrates a case where the bottom electrode 111 of the green sub-pixel G has the second shape type, and the bottom electrode 111 of the red sub-pixel R and the bottom electrode 111 of the blue sub-pixel B have the first shape type. As shown in FIG. 7, along the row direction X along which the sub-pixels 11 are arranged, the red sub-pixels R which have the bottom electrodes 111 of the first shape type and the green sub-pixels G which have the bottom electrodes 111 of the second shape type are arranged alternately in the odd-numbered rows of the sub-pixels 11, and the green sub-pixels G which have the bottom electrodes 111 of the second shape type and the blue sub-pixels B which have the bottom electrodes 111 of the first shape type are arranged alternately in the even-numbered rows of the sub-pixels 11. Along the column direction Y along which the sub-pixels 11 are arranged, the red sub-pixels R which have the bottom electrodes 111 of the first shape type and the green sub-pixels G which have the bottom electrodes 111 of the second shape type are arranged alternately in the odd-numbered columns of the sub-pixels 11; and the green sub-pixels G which have the bottom electrodes 111 of the second shape type and the blue sub-pixels B which have the bottom electrodes 111 of the first shape type are arranged alternately in the even-numbered columns of the sub-pixels 11.

Figure 8:
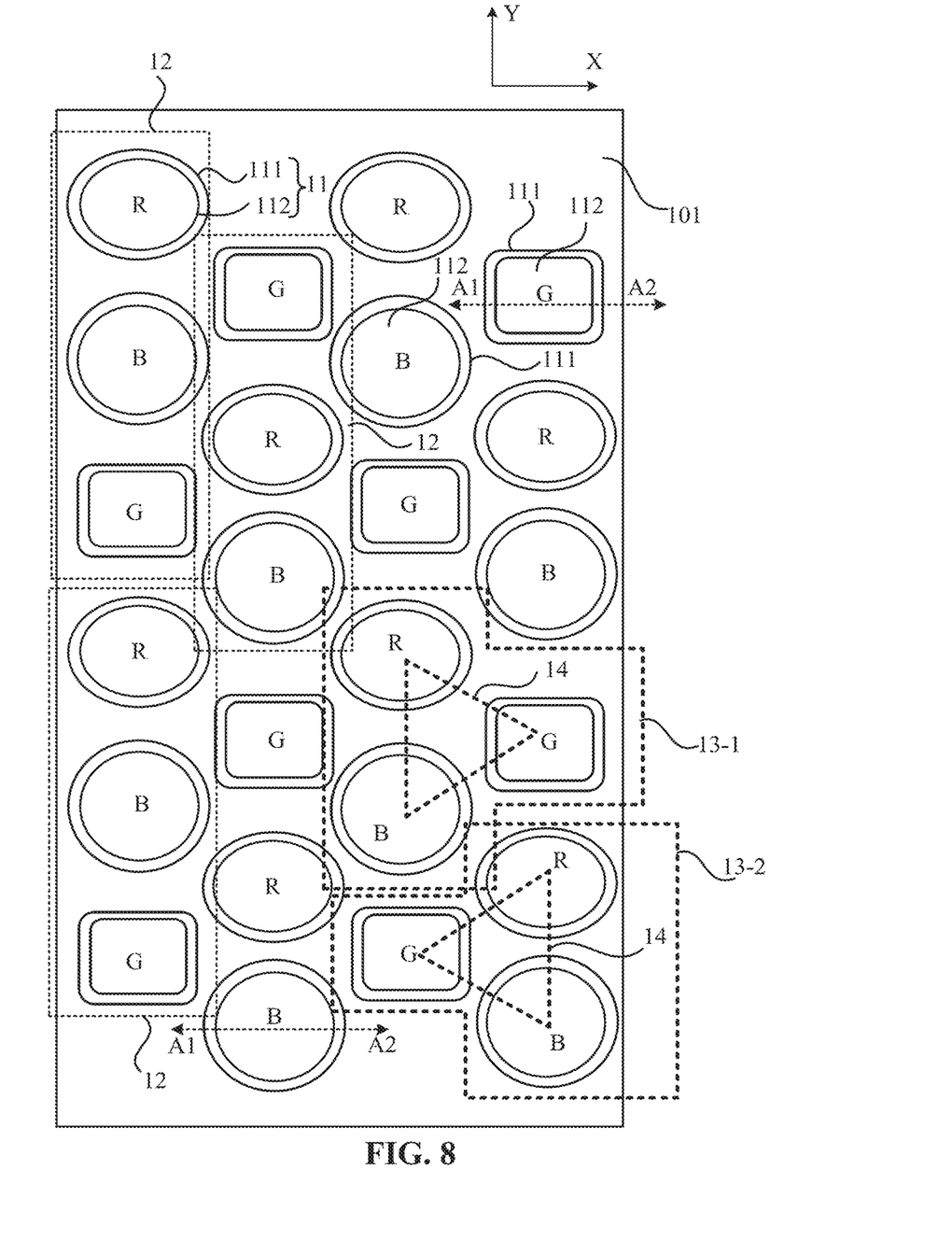
FIG. 8 is a structure diagram showing a part of a transparent display region of another display panel according to an embodiment.

Optionally, based on the above-mentioned embodiment, FIG. 8 is a structure diagram showing a part of a transparent display region of another display panel according to an embodiment, and the bottom electrode 111 of the sub-pixel 11 which has the bottom electrode 111 of the first shape type has the same shape as the light-emitting region 112 of the sub-pixel 11. Compared with the technical solution illustrated in FIG. 2, the technical solution illustrated in FIG. 8 may improve the transparency of the transparent display region 10.

FIG. 8 exemplarily illustrates a case where the shapes of the light-emitting regions 112 of all sub-pixels 11 are not the same. The light-emitting regions 112 of a first part of sub-pixels 11 are in the shape of a rounded rectangle, the light-emitting regions 112 of a second part of sub-pixels 11 are circular, and the light-emitting regions 112 of a third part of sub-pixels 11 are elliptical.

Figure 9:
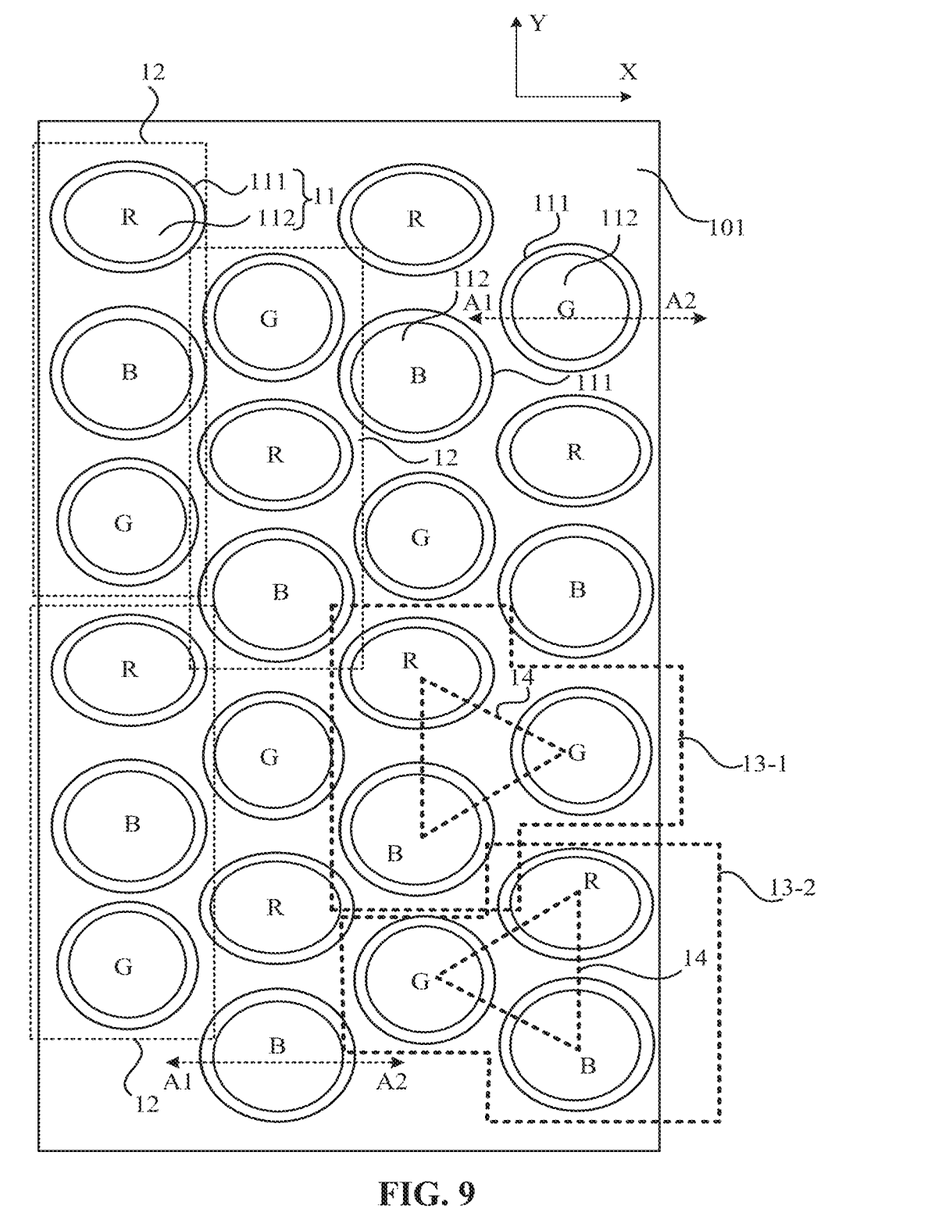
FIG. 9 is a structure diagram showing a part of a transparent display region of another display panel according to an embodiment.

Optionally, based on the above-mentioned embodiment, FIG. 9 is a structure diagram showing a part of a transparent display region of another display panel according to an embodiment. The bottom electrode 111 of the sub-pixel 11 which has the bottom electrode 111 of the second shape type is circular or elliptical. Compared with the technical solution illustrated in FIG. 8, the technical solution illustrated in FIG. 9 may improve the transparency of the transparent display region 10 and reduce the diffraction impact.

FIG. 9 exemplarily illustrates a case where all sub-pixels 11 have the light-emitting regions 112 of the same shape, that is, the first shape type.

Figure 10:
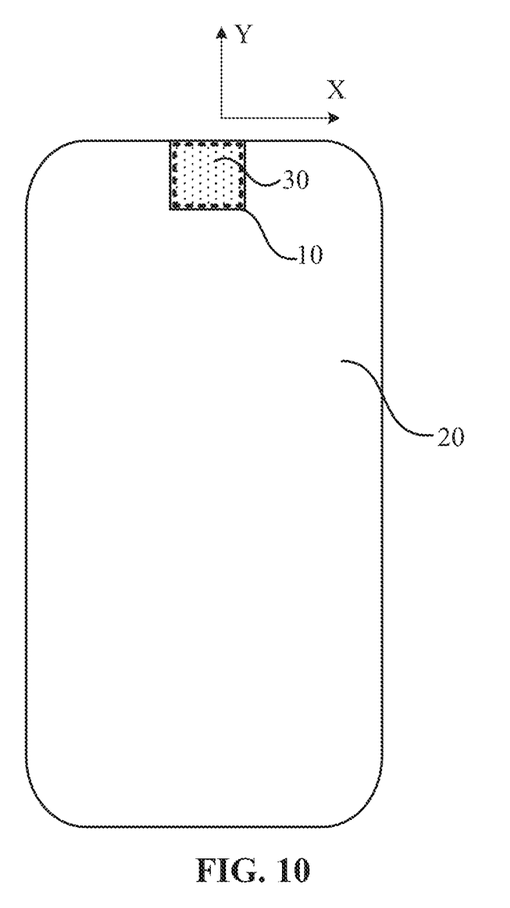
FIG. 10 is a structure diagram of another display panel according to an embodiment.

FIG. 10 is a structure diagram of another display panel according to an embodiment. Based on the above-mentioned embodiment, the display panel further includes a main display region 20 disposed around at least a part of the transparent display region 10. A plurality of sub-pixels are disposed in the main display region 20 and bottom electrodes of the sub-pixels in the main display region 20 have the second shape type.

A transmittance of the main display region 20 is lower than a transmittance of the transparent display region 10. The transparent display region 10 is correspondingly provided with a photosensitive component 30 which is configured to collect light transmitted through the transparent display region 10. The photosensitive component 30 may include at least one of a camera photosensitive component, a fingerprint identification sensor, or the like. The transparent display region 10 not only can implement the display function but also has the sufficient light transmittance for ensuring precision of photosensitive identification by the photosensitive component. The main display region 20 is a normal display region in the display panel and is configured to implement a normal display in the region where the photosensitive component is not provided in the display panel. FIG. 10 exemplarily illustrates merely a case where the transparent display region 10 is disposed at the edge of the display panel. The position of the transparent display region 10 in the display panel is not limited in this embodiment.

Figure 11:
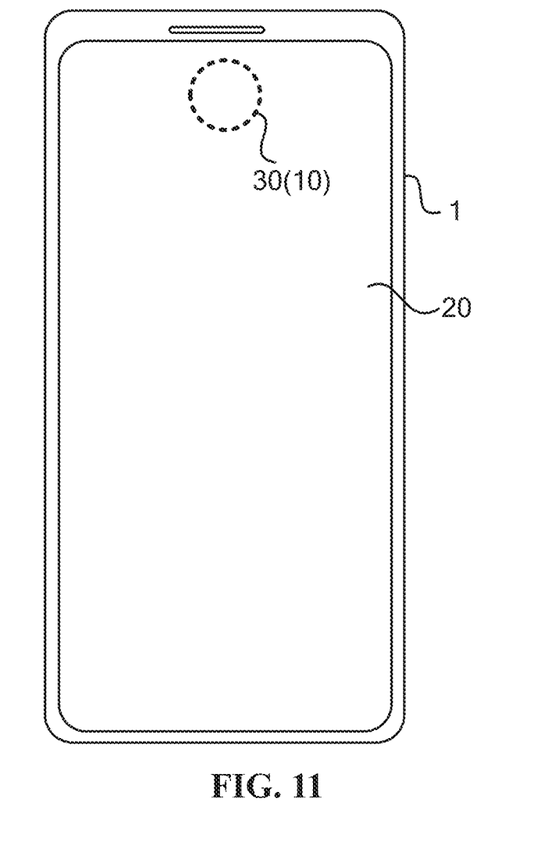
FIG. 11 is a structure diagram of a display device according to an embodiment.

This embodiment provides a display device. FIG. 11 is a structure diagram of a display device according to an embodiment. The display device 1 includes the display panel provided by any embodiment and the photosensitive component 30 disposed below the transparent display region 10.

The display device 1 may include a mobile phone, a tablet computer, a laptop, and the like. The display device provided in this embodiment includes the display panel in the above-mentioned embodiment. Therefore, the display device provided in this embodiment also has the effects described in the above-mentioned embodiment, and details are not repeated herein.

What is claimed is:

1. A display panel having a transparent display region, comprising:
    a plurality of sub-pixels disposed in the transparent display region,
    wherein, in two adjacent sub-pixels among at least a part of a plurality of two adjacent sub-pixels of the plurality of sub-pixels, a bottom electrode of a first sub-pixel of the two adjacent sub-pixels has a first shape type, and a bottom electrode of a second sub-pixel of the two adjacent sub-pixels has a second shape type, the second shape type is the same as a shape of a light-emitting region of the second sub-pixel of the two adjacent sub-pixels, and
    wherein the first shape type is different from the second shape type.

2. The display panel according to claim 1, wherein the first shape type comprises a circle or an ellipse, and the plurality of sub-pixels are arranged in lines.

3. The display panel according to claim 2, wherein the sub-pixels in each line of the plurality of sub-pixels are divided to form a plurality of first repeating units, each first repeating unit among the plurality of first repeating units comprises three sub-pixels of the plurality of sub-pixels,
    wherein, in the first repeating unit of at least a part of the plurality of first repeating units, bottom electrodes of two adjacent sub-pixels have the first shape type, and a bottom electrode of a third sub-pixel has the second shape type.

4. The display panel according to claim 3, wherein in the first repeating unit, the sub-pixel having the bottom electrode of the second shape type is a green sub-pixel.

5. The display panel according to claim 2, wherein the sub-pixels in each line of the plurality of sub-pixels are divided to form a plurality of first repeating units, each first repeating unit among the plurality of first repeating units comprising three sub-pixels of the plurality of sub-pixels,
    wherein, in the first repeating unit of at least a part of the plurality of first repeating units, bottom electrodes of two adjacent sub-pixels have the second shape type, and a bottom electrode of a third sub-pixel has the first shape type.

6. The display panel according to claim 5, wherein in the first repeating unit, the two adjacent sub-pixels having the bottom electrodes of the second shape type are a green sub-pixel and a blue sub-pixel.

7. The display panel according to claim 1, wherein in the line of the plurality of sub-pixels, sub-pixels which have bottom electrodes of the first shape type and sub-pixels which have bottom electrodes of the second shape type are arranged alternately.

8. The display panel according to claim 1, wherein the plurality of sub-pixels are arranged in a line along a first direction, the plurality of sub-pixels form a plurality of pixels, and each pixel among the plurality of pixels comprises three sub-pixels emitting different colors; wherein two sub-pixels in each pixel are arranged along the first direction, and virtual centers of the three sub-pixels in each pixel are connected to form a virtual triangle.

9. The display panel according to claim 8, wherein two virtual triangles which correspond to two pixels adjacently arranged along the first direction have vertex angles pointing to opposite directions along a second direction, and the first direction is perpendicular to the second direction.

10. The display panel according to claim 1, wherein the plurality of sub-pixels are arranged in a matrix; and
along a row direction of the matrix, the sub-pixels which have bottom electrodes of the first shape type and the sub-pixels which have bottom electrodes of the second shape type are arranged alternately, and
along a column direction of the matrix, the sub-pixels which have bottom electrodes of the first shape type and the sub-pixels which have bottom electrodes of the second shape type are arranged alternately.

11. The display panel according to claim 10, wherein shapes of light-emitting regions of the plurality of sub-pixels comprise at least one of a triangle, a square, a pentagon, a circle, an ellipse, and a rounded rectangle.

12. The display panel according to claim 10, wherein the second shape type comprises at least one of a triangle, a square, a pentagon, a circle, an ellipse, and a rounded rectangle.

13. The display panel according to claim 1, wherein along a direction of thickness of the display panel, a projection of a light-emitting region of the sub-pixel among the plurality of sub-pixels on a bottom electrode of the sub-pixel is within the bottom electrode of the sub-pixel; and
a ratio of an area of a light-emitting region of a sub-pixel which has a bottom electrode of the first shape type to an area of the bottom electrode of the first shape type is less than a ratio of an area of a light-emitting region of a sub-pixel which has a bottom electrode of the second shape type to an area of the bottom electrode of the second shape type.

14. The display panel according to claim 1, further comprising a main display region disposed around at least a part of the transparent display region, wherein the plurality of sub-pixels comprising a plurality of first sub-pixels disposed in the main display region, and bottom electrodes of the plurality of first sub-pixels in the main display region have the second shape type.

15. The display panel according to claim 14, wherein a transmittance of the main display region is lower than a transmittance of the transparent display region.

16. The display panel according to claim 1, wherein the plurality of sub-pixels comprise light-emitting regions of a same shape.

17. The display panel according to claim 1, wherein the plurality of sub-pixels comprise light-emitting regions of different shapes.

18. The display panel according to claim 1, wherein a light-emitting region of each sub-pixel among the plurality of sub-pixels is located in a middle region of a bottom electrode of the each sub-pixel.

19. A display device, comprising the display panel according to claim 1 and comprising a photosensitive component disposed below the transparent display region of the display panel.

20. A display panel having a transparent display region, comprising:
a plurality of sub-pixels disposed in the transparent display region,
wherein, in two adjacent sub-pixels among at least a part of a plurality of two adjacent sub-pixels of the plurality of sub-pixels, a bottom electrode of a first sub-pixel of the two adjacent sub-pixels has a first shape type, and a bottom electrode of a second sub-pixel of the two adjacent sub-pixels has a second shape type, the second shape type is the same as a shape of a light-emitting region of the second sub-pixel of the two adjacent sub-pixels,
wherein the first shape type comprises a circle or an ellipse, and the plurality of sub-pixels are arranged in lines,
wherein the sub-pixels in each line of the plurality of sub-pixels are divided to form a plurality of first repeating units, each first repeating unit among the plurality of first repeating units comprises three sub-pixels of the plurality of sub-pixels, and
wherein, in the first repeating unit of at least a part of the plurality of first repeating units, bottom electrodes of two adjacent sub-pixels have the first shape type, and a bottom electrode of a third sub-pixel has the second shape type.

\* \* \* \* \*